April 27, 1965 R. C. A. ELAND 3,181,069

U.H.F. TELEVISION TUNER

Filed June 22, 1960 4 Sheets-Sheet 1

INVENTOR.
ROBERT C.A. ELAND

BY

OSTROLENK, FABER, GERB & SOFFEN

ATTORNEYS

U.H.F. TELEVISION TUNER

Filed June 22, 1960 4 Sheets-Sheet 2

INVENTOR.
ROBERT C.A. ELAND
BY
OSTROLENK, FABER, GERB & SOFFEN
ATTORNEYS

April 27, 1965 R. C. A. ELAND 3,181,069

U.H.F. TELEVISION TUNER

Filed June 22, 1960 4 Sheets-Sheet 3

INVENTOR.
ROBERT C.A. ELAND
BY
OSTROLENK, FABER, GERB & SOFFEN
ATTORNEYS

U.H.F. TELEVISION TUNER

Filed June 22, 1960

INVENTOR.
ROBERT C.A. ELAND

BY
OSTROLENK, FABER, GERB & SOFFEN

ATTORNEYS

United States Patent Office 3,181,069
Patented Apr. 27, 1965

3,181,069

UHF TELEVISION TUNER

Robert C. A. Eland, Arcadia, Calif., assignor to Standard Coil Products Co., Inc., Melrose Park, Ill., a corporation of Illinois Filed June 22, 1960, Ser. No. 38,018
10 Claims. (Cl. 325—453)

This invention relates to all-UHF television tuner units, and more particularly relates to novel constructions thereof with minimum oscillator radiation and reduced cost.

An all-UHF television tuner contains a tunable preselector and a variable oscillator to tune-in the 70 channels over the 470 to 890 mc. range. The UHF signals are circuitally contained in an enclosed metal chassis to reduce radiations. To minimize oscillator radiations, an RF amplifier stage is used, as is successfully done in VHF tuners. A grounded-grid triode amplifier is operable over the UHF range, as is a grounded grid oscillator.

The present invention simplifies such UHF tuner circuit by employing the oscillator triode stage as a mixer as well; and provides a novel zig-zag tunable line to permit reduced volumetric proportion. The result is a greatly reduced radiation ratio than heretofore attained.

It has heretofore been a tedious, skilled and costly process to build a small UHF television tuner, with the components requiring precise dimensions, positions and wiring-in. The present invention provides novel and practical physical construction, and interrelation of the chassis and components.

The invention UHF tuner is composed of two major subassemblies readily insertable in a cover-box for simple precise final assembly. The subassemblies are mounted on chassis sub-units, wired-in and pretested before final assembly.

The chassis sub-units are arranged, with the inter-linked cover-box, to form novel inexpensive compartmentalized or isolated circuit sections. The result is substantially reduced cost of mass production of the UHF tuners, greatly increased uniformity of results, minimum of final test time and rejects. Each subassembly can be made on a line basis.

The chassis-box cover is formed in a novel manner, incorporating a wire mesh or screen on its inner face that presses against the edge of said formed compartments to shield against radiation.

It is accordingly an object of the present invention to provide a novel all-UHF television tuner.

Another object of the present invention is to provide a novel all-UHF tuner having efficient shielding to insure minimum radiation while permitting reduced cost.

A further object of the present invention is to provide a novel all-UHF tuner with sub-unit constructions that are separably assembled and wired-in.

Still another object of the present invention is to provide a novel all-UHF tuner with sub-chassis units arranged to form circuit compartmentalization in a practical relatively inexpensive manner.

Still a further object of the present invention is to provide a novel all-UHF tuner with a cover containing a wire mesh that inexpensively shield the tuner compartments.

These and further objects of the invention will become more apparent from the following description of an exemplary embodiment thereof, illustrated in the drawings in which.

Figure 1:
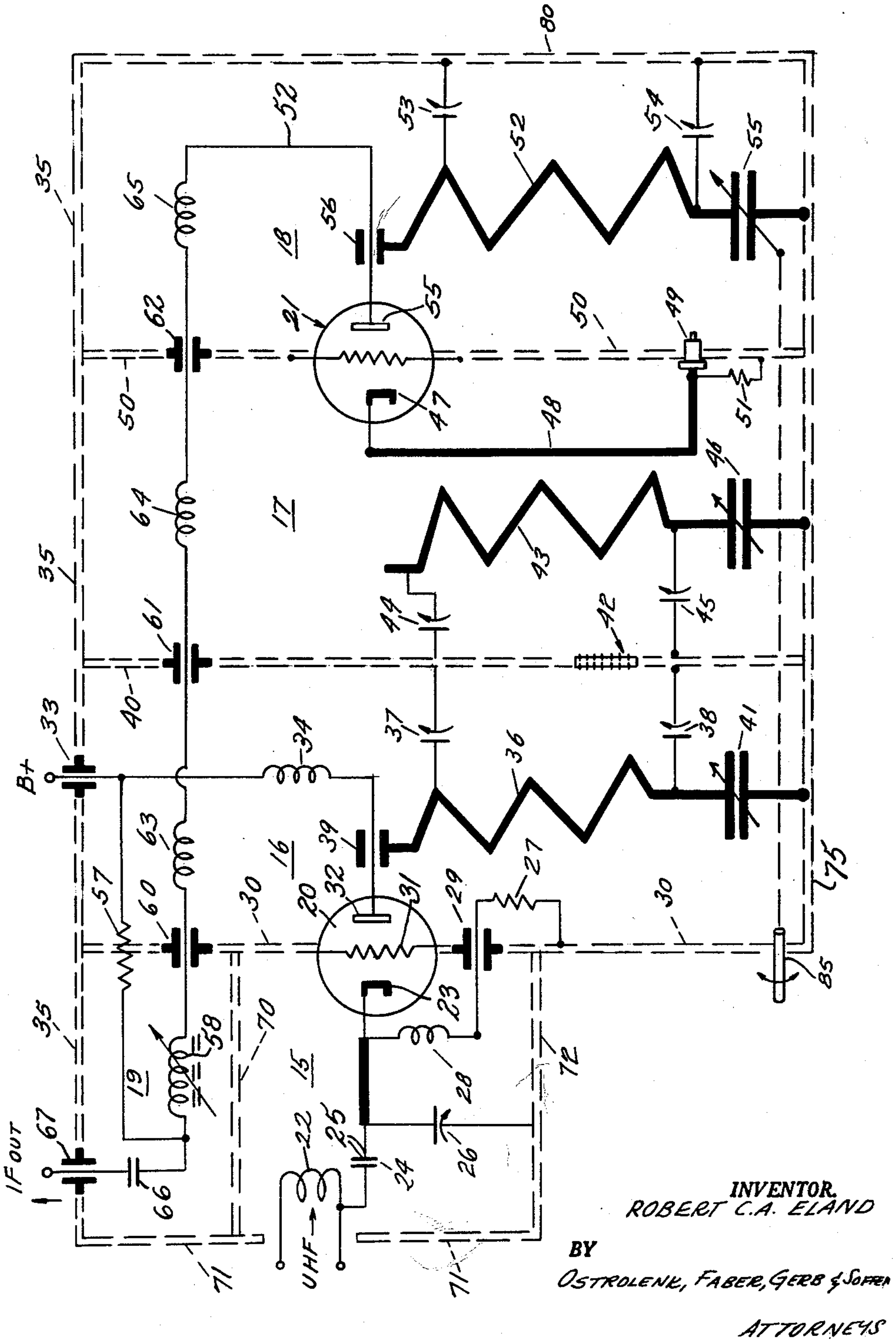
FIGURE 1 is a circuit diagram of the exemplary all-UHF tuner.

The diagram, FIGURE 1, illustrates the several isolation or shield compartments 15 through 19 for the UHF tuner circuitry. There are two grounded-grid triode stages 20, 21. The UHF antenna lead-ins connect to input coil 22, one end of which is coupled to the cathode input 23 of RF amplifier stage 20 through coupling condenser 24 and fixed line 25.

A trimmer condenser 26 balances the input circuit. The tube 20 is input-biased by a low value grounded resistor 27 to cathode 23 through RF choke coil 28 and a feed-through condenser 29 between compartments 15, 16, through wall 30. Grounding grid electrode 31 of RF amplifier stage 20 serves to shield oscillator energy at anode electrode 32 from radiating out through cathode 23 and the antenna.

The tube 20 is mounted to straddle partition wall 30 to further isolate the RF input section 15 and the RF output section 16. The anode B+ supply is shunt fed to anode 32 from terminal feed-through 33 at chassis top-plate 35, and RF choke 34. The RF output circuit in compartment 16 comprises a tuned line-variable condenser arrangement: line 36 coupled to anode 32 through feed-through condenser 39, trimmer condensers or feed-throughs 37, 38 at each line end to ground at wall 40, and variable tuning condenser 41. The physical length of fixed line 36 is proportioned to co-act with variable condenser 41 to permit tuning over the 470 to 890 mc. range in 180° of the condenser rotation.

In the exemplary embodiment, the line 36 was made of a silver-plated conductor, ⅛″ wide by $\frac{1}{32}$″ thick, and 2⅛″ long. To save in the linear dimension to accommodate long line 36 in the chassis compartment 16, its over-all length was reduced to 1½″. This length reduction was provided by the zig-zag or "pleated" configuration shown in the figures. The effective inductive action of line 36 remains unimpaired by such novel arrangement.

Figure 9:
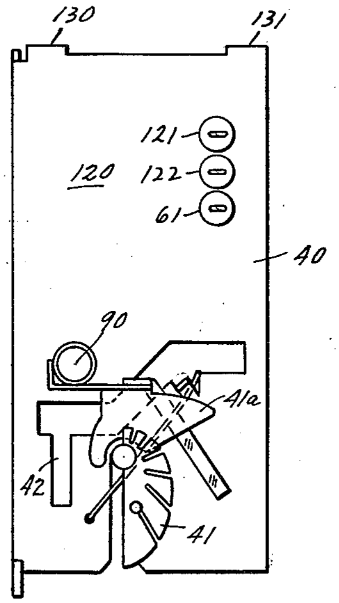
FIGURES 8, 9 and 10 are respective side, end and top views of another sub-unit assembly of the tuner.

The mixer input compartment 17 is coupled to the RF compartment 16 through a shaped aperture 42 of given area in the wall 40 between them (see also FIGURE 9). The tuned mixer input is composed of a zig-zag line 43, end feed-through trimmers 44, 45, and tuning condenser 46. The mixer herein is combined in one triode stage 21 with the oscillator, as an autodyne circuit. The cathode 47 is connected as the input, to a ribbon 48 arranged close to, and along line 43 to couple therewith. Ribbon 48 terminates in an open-ended feed-through condenser 49 in wall 50 between oscillator section 18 and mixer section 17. A biasing resistor 51 connects cathode 47 to the grounded wall 50 through ribbon 48.

The oscillator tunable unit is composed of long zig-zag line 52, end trimmers 53, 54, and series tuning condenser 55. The anode 56 is coupled to the end of line 52 through a feed-through condenser 56. The anode B+ supply is shunt fed to electrode 55 from feed-through condenser 33 through dropping resistor 57, adjustable IF output coil 58, a series of inter-compartment feed-through condensers 60, 61, 62, and a series of RF choke coils therebetween 63, 64, 65.

In this manner a common B+ feed is used and no deleterious inter-coupling occurs in the intervening compartments.

The IF output compartment 19 contains the IF output coil 58, adjustable through exterior end projection, series condenser 66, and feed-through terminal 67 in top chassis wall 35. A wall 70 isolates sections 15 and 19. The (IF) output compartment 19 is formed by shield wall 70, part of partition wall 30, part of top chassis plate 35, and an end wall 71. A bottom wall 72 completes four sides of RF input section 15, together with walls 30 and 70.

Section 16 contains part of cover bottom wall 75, part of chassis sub-unit plate 35, and vertical walls 30, 40. Similarly, compartment 17 contains vertical walls 40 and 50, with top and bottom portions of plates 35 and 75. End section 18 contains wall 50, and end wall 80 of the cover, with sections of plates 35 and 75. It is understood that the cover-box to be described, forms one side wall for sections 16, 17 and 18, and the removable side cover to be shown hereinafter, shield and seal the opposite vertical side of these sections, as well as that of section 19.

Figure 2:
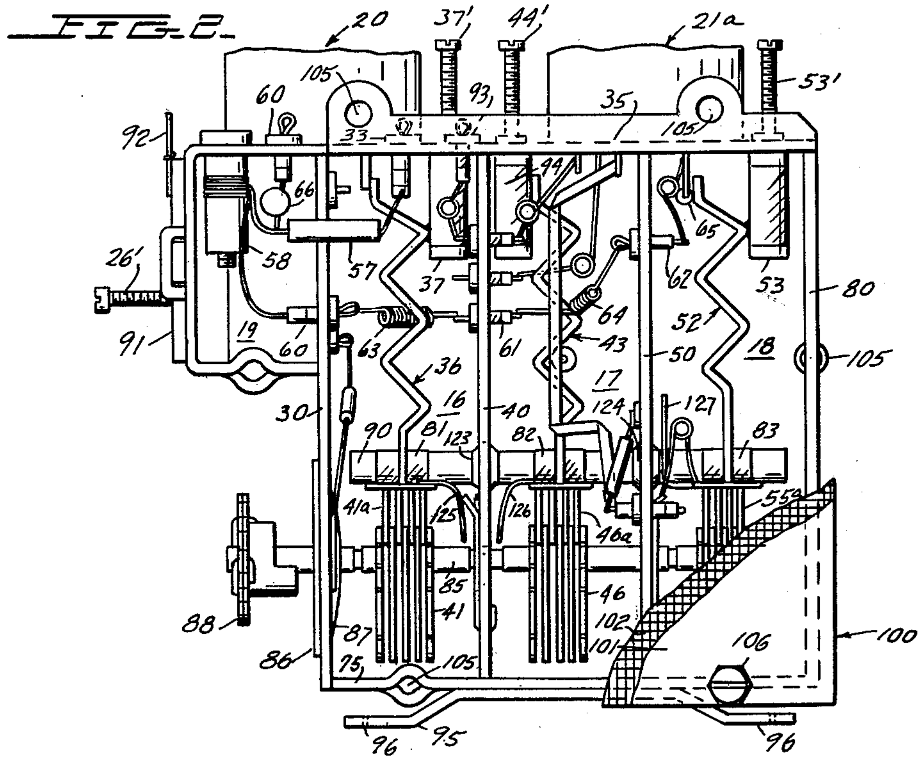
FIGURE 2 is a side elevational view of the exemplary all-UHF tuner, with the cover removed.
Figures 3, 4:
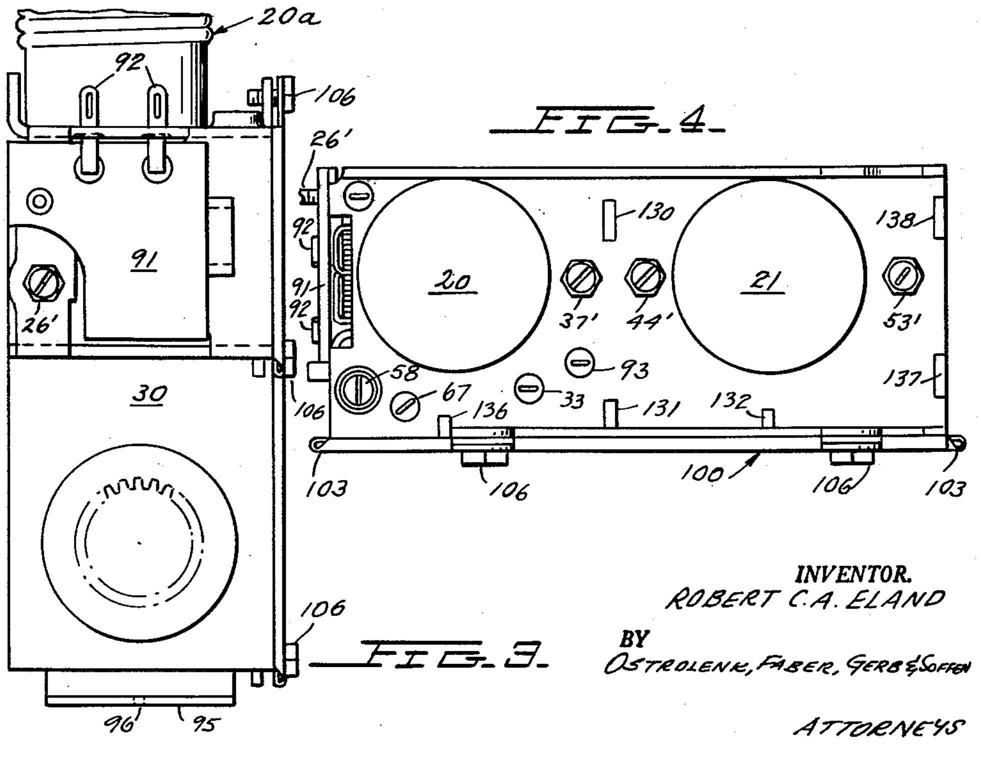
FIGURES 3 and 4 are respective end and top views of the tuner of FIGURE 2.

FIGURES 2, 3 and 4 illustrate the exemplary tuner construction corresponding to the circuit of FIGURE 1, like parts being identified with the same numerals. The three isolated vertical compartments 16, 17, 18 house respectively the tunable RF amplifier output, mixer input and oscillator circuitry. The three ganged variable condensers 41, 46 and 55 have a common tuning shaft 85. Shaft 85 projects through an aperture in wall 30 and is secured by washers 86, 87, that in turn seal the aperture when brazed or soldered to wall 30. A control gear 88, preferably of the anti-back lash type, is secured to and drives shaft 85. The shaft 85 and the condenser rotor plates attached thereto are at the case or ground potential.

The stator plates 41*a*, 46*a* and 55*a* of the condensers are insulatingly supported on a transverse ceramic rod 90 mounted in present apertures in central partitions 40, 50. The stators 41*a*, 46*a*, 55*a* are supported by the silvered bands 81, 82, 83 on the rod 90, to which they are soldered. The lower ends of the lines 36, 43, 52 are soldered to the bands 81, 82, 83, and are thus connected into the stator circuits as indicated in the circuit diagram FIGURE 1.

The several feed-through terminals, condensers, coils and other small components of the circuit already described, are shown in physical position in the unit. The RF tube 20 has the tube shield 20*a* (FIGURE 3); tube 21 has shield 21*a*. The several trimmer condensers are mounted with their respective adjusting screws 26′, 37′, 44′ and 53′ shown projecting outside for accessibility. The antenna input section is constructed with a composition end-plate 91 containing the lead-in terminals 92, 92 (FIGURE 3). A tube heater supply terminal 93 (FIGURE 2) is shown on the chassis top 35. A mounting bracket 95 is attached to the base 75 exterior, having mounting holes 96, 96, to prevent radiation through interior apertures.

Figure 6:
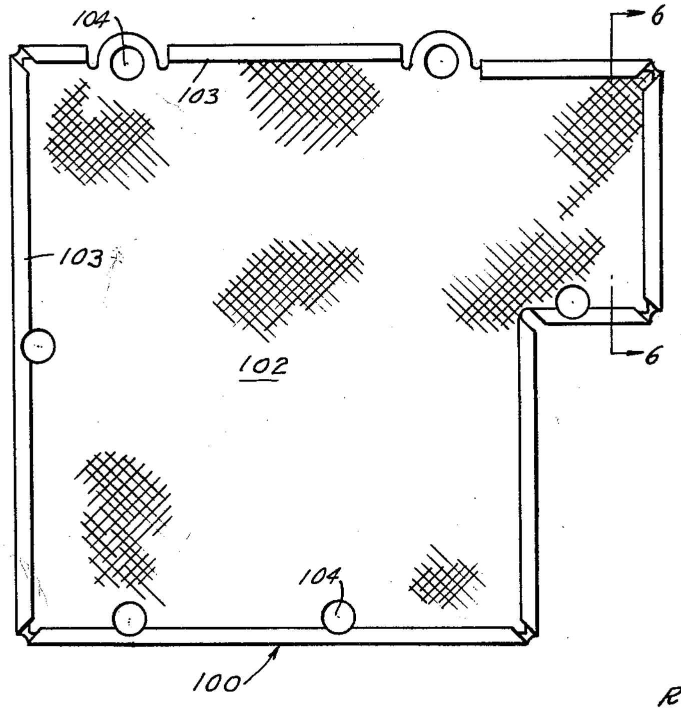
Figure 5:
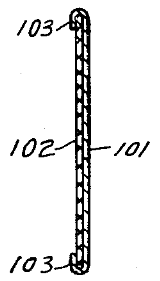
FIGURE 5 is an interior plan view of the tuner cover, FIGURE 6 being a partial cross-sectional view thereof across the line 6—6.

A practical, inexpensive and novel cover 100 is used for the invention tuner. Cover 100 is shown in partial view, in position on the tuner in FIGURE 2, and in inside plan and sectional views in FIGURES 5 and 6 respectively. Cover 100 is composed of an outer metal sheet 101 and a waffled metal screen or mesh 102 on its interior. The edges 103 of cover 100 are folded-over as shown, gripping the adjacent edges of the mesh 102 to complete the cover assembly. Apertures 104, 104 about the edges of cover 107 mate with corresponding screw holes 105, 105 in the tuner frame (see FIGURE 2) for screws 106 that attach them together.

The novel cover 100 overlaps the basic tuner frame to the extent of its folded-over edges 103. In this way the soft screen mesh 102 is pressed against the adjacent edges of the tuner frame and portions that form the isolated sections 16, 17, 18, 19. The mesh 102 serves to electrically shield the portion edges to complete the assembled compartments in an economical yet most effective manner. The resilience and resultant compliance of the metal mesh 102 pressed by the cover body 101 against the edges of the compartments insures the full electrical isolation.

Figure 7:
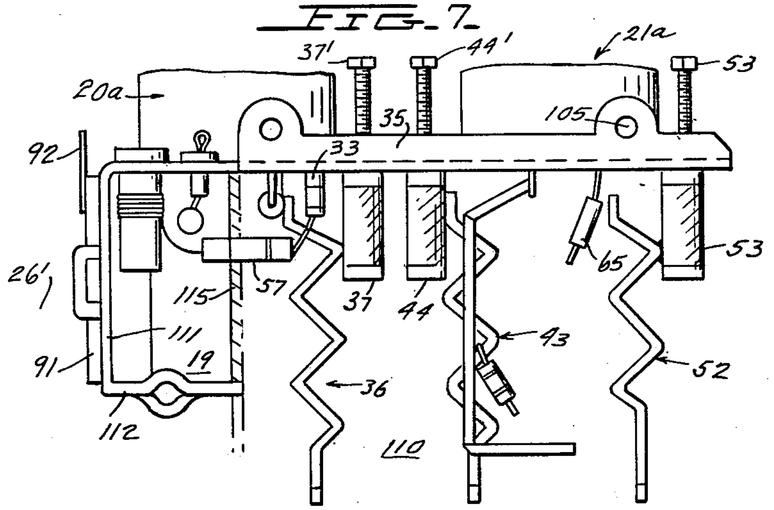
FIGURE 7 is a side elevational view of one sub-unit assembly of the tuner.
Figure 8:
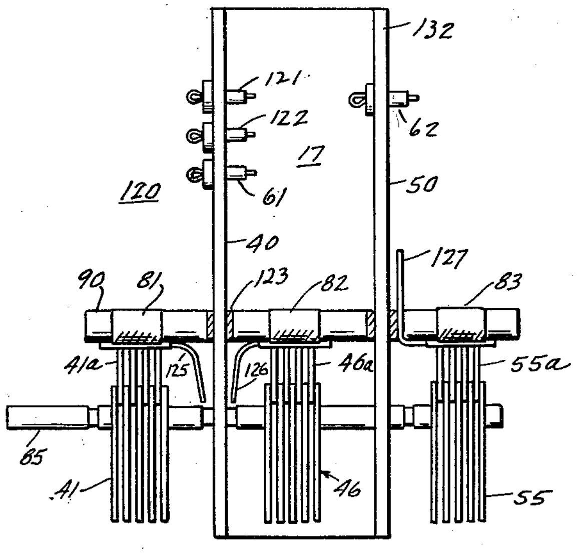
Figures 10, 11:
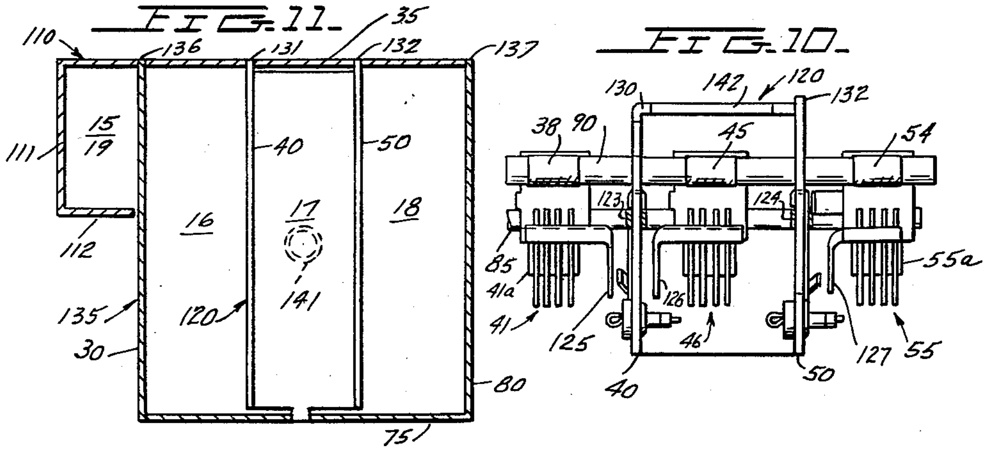
FIGURES 11 and 12 are diagrams of the sub-unit arrangements, and the shield compartments formed thereby.

An important feature of the present invention are the novel sub-assembly structures that are separately assembled, wired in, soldered, and pre-tested before final inter-assembly for the invention UHF tuner unit. FIGURE 7 illustrates the top-plate and tube sub-assembly 110; FIGURES 8, 9 and 10, the U-sub-chassis and condenser gang assembly 120; and FIGURES 11, 12 the manner of their interrelation to provide the several isolated circuit compartments and the UHF tuner construction hereof.

The top-plate sub-assembly 110 (FIGURE 7) includes the top chassis section 35 as seen in FIGURE 1 and a U-extension 111, 112 shown in FIGURE 7 integral at the RF end. Extension 111, 112 is proportioned to enclose the RF input compartment 15 and IF compartment 16 (seen in FIGURES 1 and 2), when in final assembly against wall 30. A partition shield 115 inside the extension 111, 112 establishes these two relatively small adjacent compartments 15 and 19. In FIGURE 7 the RF input compartment is not seen, but is understood to be behind the partition 115.

The associated electrical components are attached and otherwise wired-in on the top-plate assembly 110: the tube sockets (not shown), tube shields, trimmer condensers, feed-through terminals, coils, resistors, fixed capacitors, and the zig-zag fixed long lines, as indicated in FIGURE 7. The assembly is in the open, where readily accessible for wiring, soldering, and testing as a whole. All the feed-through units can be oven soldered before component wiring-in. The sub-assembly 110 can be made on a line basis, as an ordinary radio or television chassis, with no deep cavity work or critical positioning of parts.

In a similar way the U-assembly 120 (FIGURE 9) can be made as a conventional sub-assembly operation. The three-gang variable condenser section is first made as two units: the rotor plates secured to the tuning shaft 85; the stator blade groups 41*a*, 46*a*, 55*a* soldered onto silvered bands 81, 82, 83 respectively on ceramic rod 90. These two condenser units are readily jigged-up for precise assembly. With suitable locating grooves, the shaft 85 and rod 90 can be automatically positioned in the U-bracket 120 sub-assembly between walls 40, 50. The feed-through terminals as 61, 62, 121, 122 are mounted on the walls, and oven soldered prior to the condenser assembly.

Two silver bands 123, 124 centrally of rod 90 permit ready soldering-in of the rod to the U-bracket walls 40, 50. Accurate condenser final assembly and testing is thus readily feasible, in the open instead of in a crowded interior. A slotted opening 42 (FIGURE 9) in wall 40 is predeterminedly shaped for a desired degree of inter-coupling between the RF output and mixer compartments 16, 17. Stiff metal ribbons 125, 126, 127 extend from the three stator plate-sections towards adjacent portion walls 40, 50 to establish the adjustable condensers or trimmers at the respective ends of the long lines 36, 43, 52 that are indicated at 38, 45 and 54 in FIGURE 1.

The two wired and pre-tested subassemblies 110 (FIGURE 7) and 120 (FIGURE 8) are then mechanically fitted together, with top plate 35 forming a T over the U-bracket. Projections or tabs as 130, 131, 132 of bracket 120 seat into or interlock with corresponding slots in plate 35, and are secured by soldering (see FIG. 4). The few remaining electrical interconnections, between the two sub-assemblies, are thereupon completed in the open, and the unit tested as a whole consistent single, and uniform performance is readily attained in production runs by this invention, an advantageous result in compact UHF devices.

Figure 12:
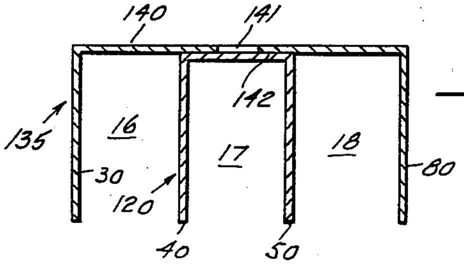

FIGURES 11 and 12 schematically illustrate the remaining assembly of the invention tuner. A rectangular box-like form 135 is inter-assembled with the T assembly 110, 120. Projections or tabs as 136, 137, 138 (see FIGURES 4 and 12) fit into slots in top-plate 35, to complete circuit compartments 16, 17 and 18. Also the compartments 15 and 19 are completed against wall 30. The tabs-in-slots are soldered. Also, an aperture 141 in the rear wall 140 of unit 135 is located behind solid rear wall 142 of the U-bracket 120. The two rear walls 140, 142 are soldered together with excess soldered locked in aperture 141. With the cover 100 affixed to the thus assembled unit, the compartments are fully electrically isolated and enclosed on six sides each.

Although the present invention has been described in connection with an exemplary embodiment, it is to be understood that modifications thereof may be made without departing from the broader aspects and spirit thereof as set forth in the following claims.

I claim:

1. A UHF tuner assembly comprising first and second sub-assemblies;

said first and second sub-assemblies including intersecting walls combinedly defining a plurality of predetermined shield compartments that isolate circuit sections of the tuner;

said first sub-assembly including a top plate, extending in a first direction and overlapping the end regions of at least some of said predetermined shield compartments, to form the shielded top walls thereof;

said top plate receiving associated circuit components mounted thereto, while disassociated from said second sub-assembly, and constructed to provide accessibility of said associated circuit components during the mounting and assembly thereof;

said second sub-assembly including a U-bracket having two spaced partition walls and a rear wall therebetween;

said partition walls parallel extending transverse to said top plate, and intersecting said top plate to define the shielded side boundaries between adjacent ones of said shield compartments;

a multi-ganged variable condenser means supported across said partition walls;

said multi-ganged variable condenser means having first means for supporting the stator plates thereof, and second means for supporting the rotor plates thereof;

said first and second means mounted to said U-bracket for sub-unit assembly and subsequent incorporation as an integral unit into cooperative seating engagement with said first sub-assembly;

said first and second means positioning their respective condenser plate for location within respective ones of said adjacent shield compartments upon the interengagement of said first and second sub-assemblies;

means for cooperatively interconnecting said assembled first and second sub-assemblies to form said predetermined shield compartments containing said associated circuit components and respective portions of said multi-ganged variable condenser means.

2. A UHF tuner as set forth in claim 1, said first and second sub-assemblies being mechanically joined into a T-like structure with said associated circuit components, and variable condensers being interwired to substantially complete the tuner circuitry.

3. A tuner as claimed in claim 1, in which said top-plate extends beyond said box-like unit with a reentrant section that coacts with the adjacent unit end wall to form a further circuit compartment.

4. A UHF tuner as set forth in claim 1, further including a cover plate, said cover plate including a wire mesh coextensive therewith and firmly pressed against the edges of said shield compartment, including said partition walls defining the boundaries between adjacent ones of said compartments, to effectively isolate said compartments.

5. A tuner as claimed in claim 4, in which said top-plate extends beyond said box-like unit with a reentrant section that coacts with the adjacent unit end wall to form a further compartment for the RF input circuit section.

6. A UHF tuner assembly comprising first and second sub-assemblies;

said first and second sub-assemblies including intersecting walls combinedly defining a plurality of predetermined shield compartments that isolate circuit sections of the tuner;

said first sub-assembly including a top plate, extending in a first direction and overlapping the end regions of at least some of said predetermined shield compartments, to form the shielded top walls thereof;

said top plate receiving associated circuit components mounted thereto, while disassociated from said second sub-assembly, and constructed to provide accessibility of said associated circuit components during the mounting and assembly thereof;

said second sub-assembly including a U-bracket having two spaced partition walls and a rear wall therebetween;

said partition walls parallel extending transverse to said top plate, and intersecting said top plate to define the shielded side boundaries between adjacent ones of said shield compartments;

a multi-ganged variable condenser means supported across said partition walls;

said multi-ganged variable condenser means having first means for supporting the stator plates thereof, and second means for supporting the rotor plates thereof;

said first and second means mounted to said U-bracket for sub-unit assembly and subsequent incorporation as an integral unit into cooperative seating engagement with said first sub-assembly;

said first and second means positioning their respective condenser plate for location within respective ones of said adjacent shield compartments upon the interengagement of said first and second sub-assemblies;

means for cooperatively interconnecting said assembled first and second sub-assemblies to form said predetermined shield compartments containing said associated circuit components and respective portions of said multi-ganged variable condenser means;

said first and second sub-assemblies being mechanically joined into a T-like structure with said associated circuit components, and variable condensers being interwired to substantially complete the tuner circuitry;

a cover plate, said cover plate including a wire mesh coextensive therewith and firmly pressed against the edges of said shield compartment, including said partition walls defining the boundaries between adjacent ones of said compartments, to effectively isolate said compartments.

7. In a tuner assembly of the character described, a shielded R.F. input section, a shielded R.F. output section electrically coupled to said input R.F. section, a mixer compartment comprising a first shielding wall electrically coupled to said output R.F. compartment, said last mentioned coupling comprising an aperture of a given area in said first shield wall between said mixer and said output R.F. compartment, an oscillator section comprising a second shielding wall electrically coupled to said mixer compartment and a shielded I.F. compartment electrically coupled to said oscillator compartment, said first and second shielding walls parallel extending and joined by a connecting wall to define a U-bracket; said U-bracket constituting a sub-assembly for efficiently shielding adjacent ones of said sections; said U-bracket carrying circuit component independently mounted while said sub-assembly is disassociated from said tuner assembly.

8. In a tuner assembly of the character described, a shielded R.F. input section, a shielded R.F. output section electrically coupled to said input R.F. section, a mixer compartment comprising a first shielding wall electrically coupled to output R.F. compartment, said last mentioned coupling comprising an aperture of a given area in said first shield wall between said mixer and said output R.F. compartment, an oscillator section comprising a second shielding wall electrically coupled to said mixer compartment and a shielded I.F. compartment electrically coupled to said oscillator compartment, said last mentioned electrical coupling comprising feed-through capacitors, said first and second shielding walls parallel extending and joined by a connecting wall to define a U-bracket; said U-bracket constituting a sub-assembly for efficiently shielding adjacent ones of said sections; said U-bracket carrying circuit component independently mounted while said sub-assembly is disassociated from said tuner assembly.

9. In a tuner assembly of the character described, an R.F. input section, an R.F. output section, a shield between said sections comprising a shielding wall and a triode, said wall and triode together shielding said input section from said output R.F. section and electrically coupling said input R.F. section and said output R.F. section, a mixer compartment comprising a first shielding wall electrically coupled to said output R.F. compartment, said last mentioned coupling comprising an aperture of a given area in said first shield wall between said mixer and said output R.F. compartment, an oscillator section comprising a second shielding wall electrically coupled to said mixer compartment and a shielded I.F. compartment electrically coupled to said oscillator compartment, said first and second shielding walls parallel extending and joined by a connecting wall to define a U-bracket; said U-bracket constituting a sub-assembly for efficiently shielding adjacent ones of said sections; said U-bracket carrying circuit component independently mounted while said sub-assembly is disassociated from said tuner assembly.

10. In a tuner assembly of the character described, an R.F. input section, an R.F. output section, a shield between said sections comprising a shielding wall and a triode, said wall and triode together shielding said input section from said output R.F. section and electrically coupling said input R.F. section, a mixer compartment comprising a first shielding wall electrically coupled to said output R.F. compartment, said last mentioned coupling comprising an aperture of a given area in said first shield wall between said mixer and said output R.F. compartment, an oscillator section comprising a second shielding wall electrically coupled to said mixer compartment and a shielded I.F. compartment electrically coupled to said oscillator compartment, said shield between said mixer and oscillator section comprising a triode acting in cooperation with said second shield wall for providing said shield between said compartments, said first and second shielding walls parallel extending and joined by a connecting wall to define a U-bracket; said U-bracket constituting a sub-assembly for efficiently shielding adjacent ones of said sections; said U-bracket carrying circuit component independently mounted while said sub-assembly is disassociated from said tuner assembly.

References Cited by the Examiner

UNITED STATES PATENTS

| | | | |
|---|---|---|---|
| 2,317,813 | 4/43 | Schoenborn | 174—35.2 |
| 2,769,961 | 11/56 | Chesney | 334—43 |
| 2,799,008 | 7/57 | Carlson | 325—461 |
| 2,871,358 | 1/59 | Krepps | 334—83 XR |
| 2,922,043 | 1/60 | Decker | 325—463 |
| 2,922,881 | 1/60 | Frey | 334—83 XR |
| 2,995,657 | 8/61 | Rummer | 334—43 |

FOREIGN PATENTS

| | | |
|---|---|---|
| 1,044,188 | 11/58 | Germany. |

DAVID G. REDINBAUGH, *Primary Examiner.*

HARRY GAUSS, HERMAN K. SAALBACH, *Examiners.*